United States Patent
Zhou et al.

(10) Patent No.: US 12,107,147 B2
(45) Date of Patent: Oct. 1, 2024

(54) SELF-ALIGNED GATE CONTACT FOR VTFETs

(71) Applicant: INTERNATIONAL BUSINESS MACHINES CORPORATION, Armonk, NY (US)

(72) Inventors: Huimei Zhou, Albany, NY (US); Kangguo Cheng, Schenectady, NY (US); Su Chen Fan, Cohoes, NY (US); Miaomiao Wang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 225 days.

(21) Appl. No.: 17/551,686

(22) Filed: Dec. 15, 2021

(65) Prior Publication Data

US 2023/0187533 A1    Jun. 15, 2023

(51) Int. Cl.
*H01L 29/66* (2006.01)
*H01L 29/78* (2006.01)

(52) U.S. Cl.
CPC .... *H01L 29/66545* (2013.01); *H01L 29/6653* (2013.01); *H01L 29/66666* (2013.01); *H01L 29/7827* (2013.01)

(58) Field of Classification Search
CPC ........... H01L 29/66545; H01L 29/6653; H01L 29/66666; H01L 29/7827

USPC .......................................................... 257/183
See application file for complete search history.

(56) References Cited

U.S. PATENT DOCUMENTS

| | | | |
|---|---|---|---|
| 9,257,531 B2 | 2/2016 | Seo et al. | |
| 9,425,105 B1 | 8/2016 | Basker et al. | |
| 9,496,362 B1 | 11/2016 | Alptekin et al. | |
| 10,263,122 B1 | 4/2019 | Zang et al. | |
| 10,355,106 B2 | 7/2019 | Bao et al. | |
| 10,497,798 B2 | 12/2019 | Xie et al. | |
| 10,529,624 B2 | 1/2020 | Leobandung | |
| 2017/0301776 A1* | 10/2017 | Zhang | H01L 29/7827 |
| 2019/0088764 A1 | 3/2019 | Xie et al. | |
| 2019/0267325 A1 | 8/2019 | Lee et al. | |
| 2019/0385917 A1 | 12/2019 | Lee et al. | |
| 2020/0027981 A1* | 1/2020 | Park | H01L 29/7827 |
| 2020/0119010 A1* | 4/2020 | Lee | H01L 21/823481 |
| 2020/0235238 A1* | 7/2020 | Lee | H01L 29/42376 |

* cited by examiner

*Primary Examiner* — Mohammad M Hoque
(74) *Attorney, Agent, or Firm* — Tutunjian & Bitetto, P.C.; Samuel Waldbaum

(57) ABSTRACT

Semiconductor devices and methods of forming the same include forming dummy gate spacers in a trench in a semiconductor substrate. A dummy gate is formed in the trench. An exposed dummy gate spacer is replaced with a sacrificial spacer. A cap layer is formed over the dummy gate. The cap layer is etched to expose the dummy gate. The sacrificial spacer is replaced with an isolation dielectric spacer. The dummy gate is replaced with a conductor.

9 Claims, 7 Drawing Sheets

SELF-ALIGNED GATE CONTACT FOR VTFETs

BACKGROUND

The present invention generally relates to semiconductor device fabrication, and, more particularly, to fabrication of vertical transport field effect transistors (VTFETs).

As integrated circuit device density increases, VTFETs are used to help scale areal density by aligning the channel length vertically. Decreased device dimensions makes aligning masks through different fabrication stages difficult, and small mask alignment errors can cause significant device defects.

SUMMARY

A method of forming a semiconductor device includes forming dummy gate spacers in a trench in a semiconductor substrate. A dummy gate is formed in the trench. An exposed dummy gate spacer is replaced with a sacrificial spacer. A cap layer is formed over the dummy gate. The cap layer is etched to expose the dummy gate. The sacrificial spacer is replaced with an isolation dielectric spacer. The dummy gate is replaced with a conductor.

A semiconductor device includes a channel fin formed in a semiconductor substrate. A bottom source/drain structure is on the semiconductor substrate on a first side of the channel fin. A gate conductor is on a second side of the channel fin, opposite the first side. A first gate conductor spacer is between the channel fin and the gate conductor, formed from a first dielectric material. A second gate conductor spacer is formed on a side of the gate conductor opposite to the first gate conductor spacer, formed from a second dielectric material that is different from the first dielectric material.

A semiconductor device includes a semiconductor substrate, a first transistor device in a first device region of the semiconductor substrate, and a second transistor device in a second device region of the semiconductor substrate. The first transistor device includes a first channel fin formed in a semiconductor substrate, a first bottom source/drain structure on the semiconductor substrate on a first side of the channel fin, a gate conductor on a second side of the channel fin, opposite the first side, a first gate conductor spacer between the channel fin and the gate conductor, formed from a first dielectric material, and a second gate conductor spacer formed on a side of the gate conductor opposite to the first gate conductor spacer, formed from a second dielectric material that is different from the first dielectric material. The second transistor device includes a second channel fin formed in a semiconductor substrate and a second bottom source/drain structure on the semiconductor substrate on a first side of the channel fin. The second gate conductor spacer insulates the gate conductor of the first transistor device from the second bottom source/drain structure of the second transistor device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The spacing between adjacent structures in an integrated circuit using VTFETs may be decreased by forming a spacer that helps to create other structures in a self-aligned manner. By using a self-aligned process, mask alignment errors may be avoided. Contacts may additionally be formed with minimal risk of shorting to the contacts of neighboring devices.

Figure 1:
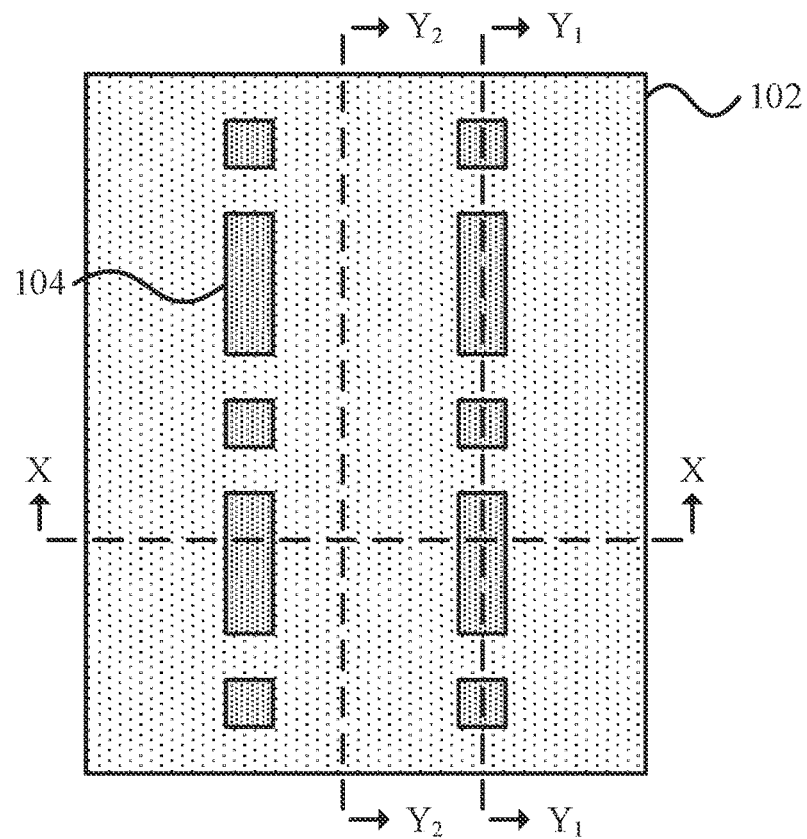
FIG. 1 is a top-down view of a semiconductor device, illustrating different cross-sectional planes that are used in the subsequent figures, in accordance with an embodiment of the present invention.

Referring now to FIG. 1, a top-down view of a set of fins 104 is shown. The fins 104 are formed on a substrate, with an interlayer dielectric 102 surrounding them. The following views are based on the cross-sections indicated in FIG. 1. In particular, a first cross-section XX cuts transversely along a set of fins 104, while a second cross-section $Y_1Y_1$ cuts through line of fins 104 in a longitudinal direction. A third cross-section $Y_2Y_2$ cuts through a space between neighboring lines of fins 104, with a view directed toward sidewalls of the line of fins 104, showing a view of the external surfaces of the fins 104.

Figure 2:
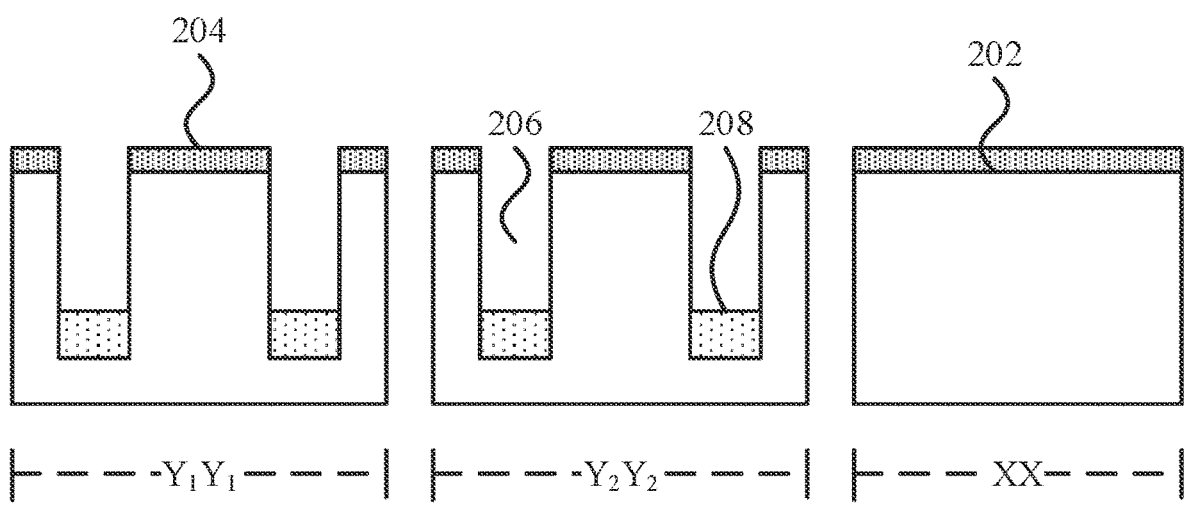
FIG. 2 is a set of cross-sectional views of a step in the formation of a semiconductor device, where shallow trench isolation regions in a semiconductor substrate are formed, in accordance with an embodiment of the present invention.

Referring now to FIG. 2, a set of cross-sectional views are shown of a step in the fabrication of a semiconductor device. A set of active regions are patterned and etched into a semiconductor substrate 202, for example using a photolithographic patterning process that etches trenches 206 into the substrate 202, using a hardmask layer 204. Shallow trench isolation (STI) regions 208 are formed within the trenches 206.

The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate.

In a photolithographic patterning process, the hardmask layer 204 may first be deposited over the substrate 202 and may then be selectively etched using a resist layer. The hardmask layer 204 may be formed from any appropriate dielectric material, such as silicon nitride. The resist layer may be formed using any appropriate photolithographic resist material that can be cured using, e.g., an appropriate wavelength of light. The light may be used to define an etch pattern, and uncured resist material may then be selectively etched away. The pattern may then be transferred to the hardmask layer 204, and may be transferred to the underlying substrate 202, using one or more selective anisotropic etch processes, such as a reactive ion etch.

As used herein, the term "selective" in reference to a material removal process denotes that the rate of material removal for a first material is greater than the rate of removal for at least another material of the structure to which the material removal process is being applied. Reactive Ion Etching (RIE) is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

The STI regions 208 may be formed by depositing an STI dielectric material, such as silicon dioxide, into the trenches 206. The trenches 206 may optionally be lined with a liner material, e.g., an oxide, before deposition of the STI dielectric material. The STI dielectric material may be deposited using any appropriate process, such as chemical vapor deposition (CVD), physical vapor deposition (PVD), or atomic layer deposition (ALD). The STI dielectric 208 may optionally be densified after deposition. The STI dielectric material 208 may be etched back using an appropriately selective etch to reduce the height of the STI regions 208 to an appropriate level.

Deposition processes discussed herein include CVD, PVD, and ALD, but it should be understood that any appropriate deposition process may be used at any point. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 3:
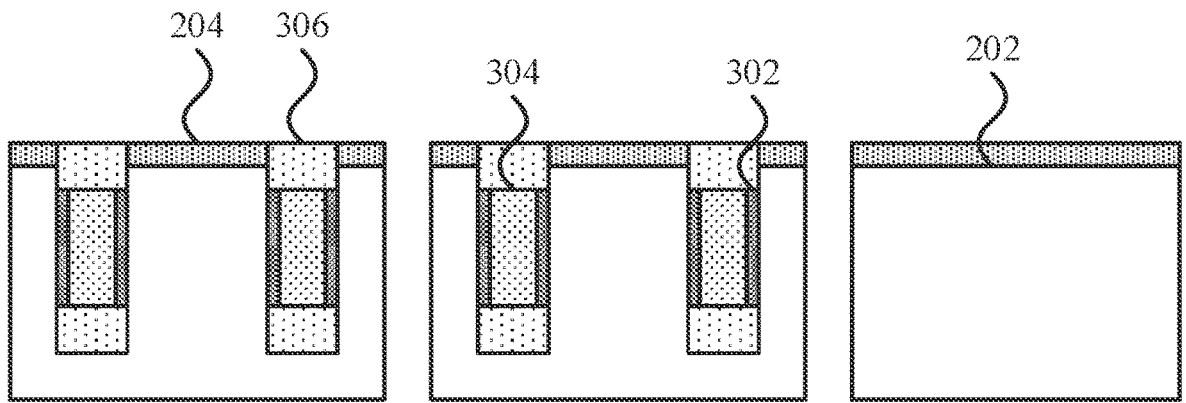
FIG. 3 is a set of cross-sectional views of a step in the formation of a semiconductor device, where a dummy fin with dummy fin spacers are formed in trenches, in accordance with an embodiment of the present invention.

Referring now to FIG. 3, a set of cross-sectional views are shown of a step in the fabrication of a semiconductor device. The trenches 208 are filled with a dummy gate structure that includes a dummy gate sidewall spacer 302, a dummy gate 304, and a top dielectric spacer 306. The dummy gate 304 may be formed with any material having appropriate etch selectivity with other structures. Exemplary dummy gate materials may include amorphous silicon or silicon oxycarbonitride. The dummy gate sidewall spacers 302 may similarly be formed from any material having appropriate etch selectivity, such as silicoboron carbonitride. The top dielectric spacer 306 may be formed from any appropriate material having appropriate etch selectivity, such as silicon dioxide or silicon carbide.

The dummy gate sidewall spacers 302 may be formed by first performing a conformal deposition using, e.g., CVD or ALD. The dummy gate sidewall spacer material may be removed from horizontal surfaces, and may further be etched back from the top surface of the hardmask layer 204, using a selective anisotropic etch, such as RIE. Dummy gate material may then be deposited using any appropriate deposition process, such as CVD, ALD, or PVD, and may then be etched back to the height of the dummy gate sidewall spacers 302 to form the dummy gates 304. The remaining space of the trenches 206 may then be filled by depositing top dielectric material and then polishing down to the level of the hardmask layer 204 using, e.g., a chemical mechanical planarization (CMP) process.

CMP may be performed using, e.g., a chemical or granular slurry and mechanical force to gradually remove upper layers of the device. The slurry may be formulated to be unable to dissolve, for example, the material of the hardmask layer 204, resulting in the CMP process's inability to proceed any farther than that layer.

Figure 4:
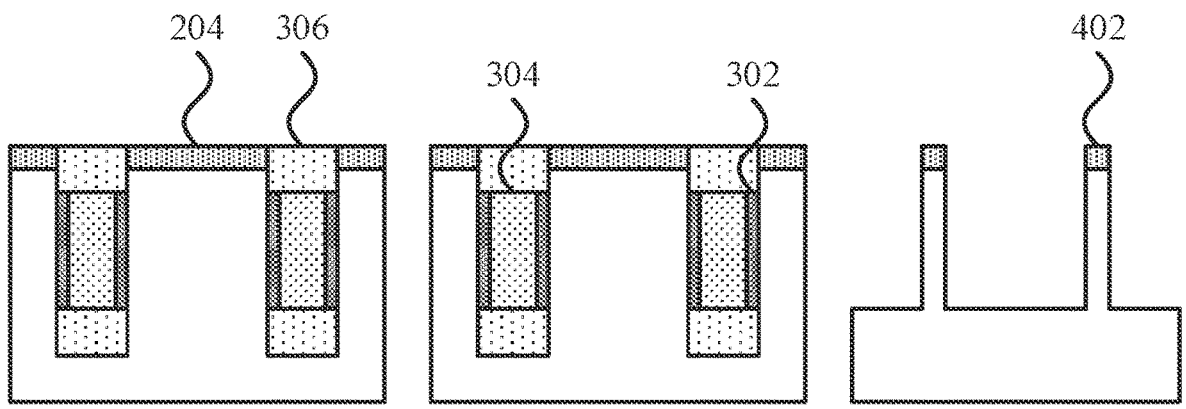
FIG. 4 is a set of cross-sectional views of a step in the formation of a semiconductor device, where fins are formed in the semiconductor substrate, in accordance with an embodiment of the present invention.

Referring now to FIG. 4, a set of cross-sectional views are shown of a step in the fabrication of a semiconductor device. Fins 402 are etched from the semiconductor substrate 202, for example using photolithography to define a fin pattern and using a selective anisotropic etch to etch down into the semiconductor substrate 202, without damaging other structures.

Figure 5:
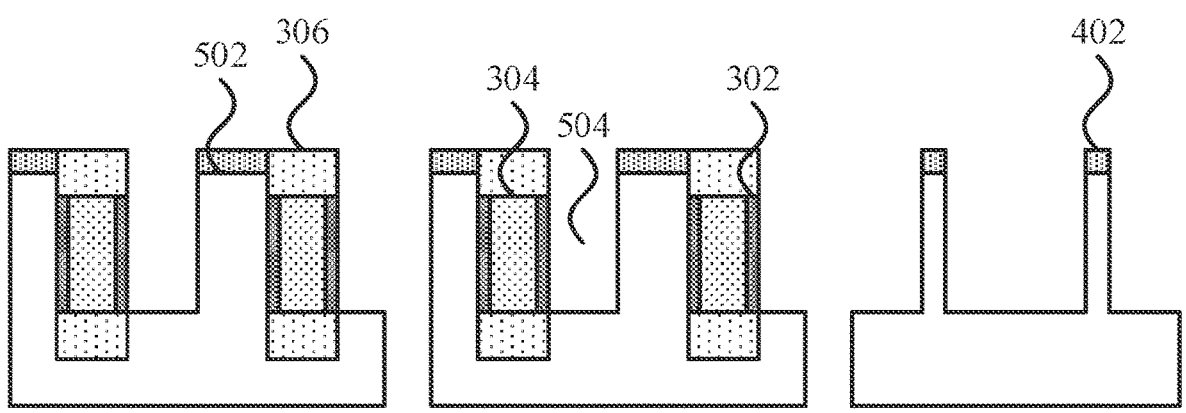
FIG. 5 is a set of cross-sectional views of a step in the formation of a semiconductor device, where channels are etched from the fins, in accordance with an embodiment of the present invention.

Referring now to FIG. 5, a set of cross-sectional views are shown of a step in the fabrication of a semiconductor device. Channel regions 502 are etched from the fins 402 using any appropriate patterning process and selective anisotropic etch. Trenches 504 are formed between the channel regions 502 and the dummy gates 304.

Figure 6:
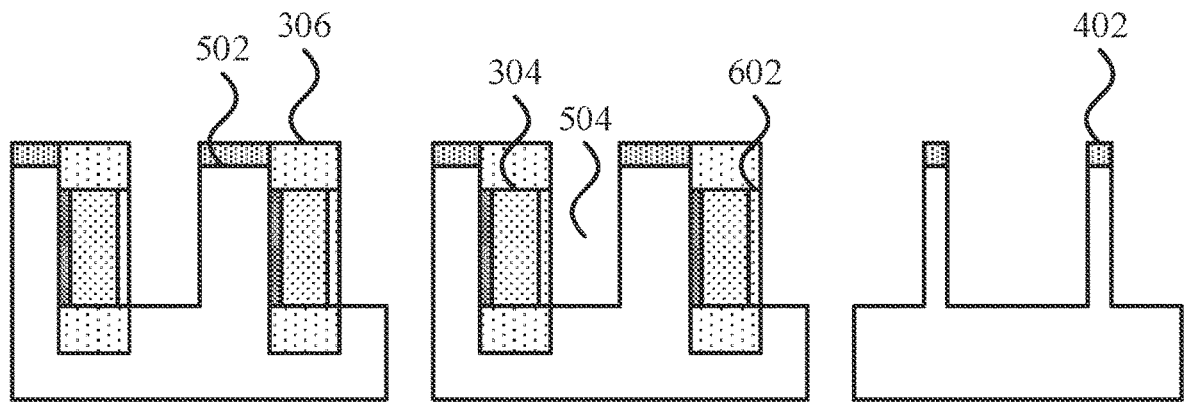
FIG. 6 is a set of cross-sectional views of a step in the formation of a semiconductor device, where an exposed dummy fin spacer is etched away and replaced by a sacrificial spacer, in accordance with an embodiment of the present invention.

Referring now to FIG. 6, a set of cross-sectional views are shown of a step in the fabrication of a semiconductor device. The exposed dummy gate sidewall spacers 302 are replaced by sacrificial spacers 602. This replacement may be performed by etching away the exposed dummy gate sidewall spacers 302 using a selective isotropic etch, such as a wet or dry chemical etch. Sacrificial material may then be conformally deposited, for example using CVD or ALD. Any sacrificial material that extends laterally past the top spacers 306 and the STI regions 208 may be removed using etch back process. The sacrificial material may include, for example, silicon dioxide.

Figure 7:
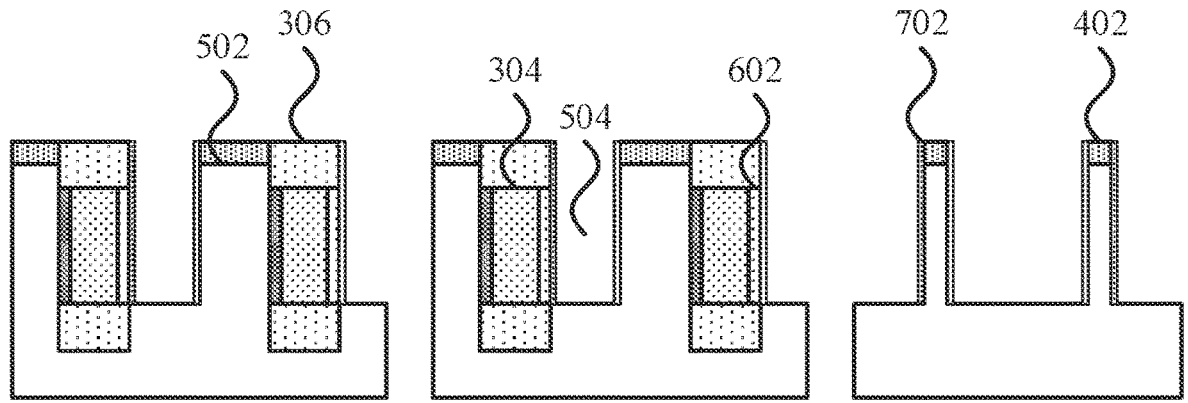
FIG. 7 is a set of cross-sectional views of a step in the formation of a semiconductor device, where a liner is formed on vertical sidewalls, in accordance with an embodiment of the present invention.

Referring now to FIG. 7, a set of cross-sectional views are shown of a step in the fabrication of a semiconductor device. A liner 702 is formed on vertical surfaces from a dielectric material, such as silicon nitride. The liner 702 may be formed by conformally depositing the dielectric material using, e.g., CVD or ALD, and then selectively removing the dielectric material from horizontal surfaces using an anisotropic etch, such as RIE. The removal of liner material from the horizontal surfaces exposes the substrate 202 within the trenches 504.

Figure 8:
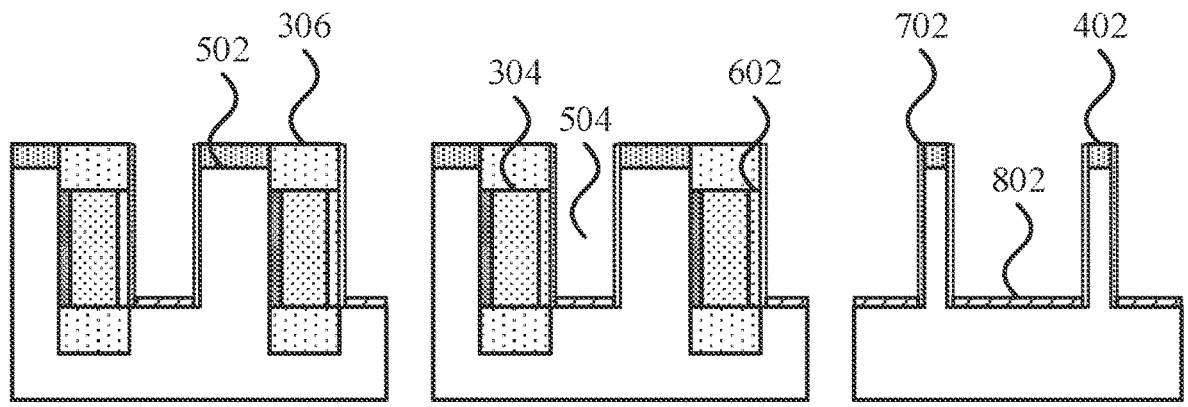
FIG. 8 is a set of cross-sectional views of a step in the formation of a semiconductor device, bottom source/drain regions are formed on the substrate, in accordance with an embodiment of the present invention.

Referring now to FIG. 8, a set of cross-sectional views are shown of a step in the fabrication of a semiconductor device. A lower doped semiconductor layer 802 is formed on exposed portions of the semiconductor substrate 202. The lower doped semiconductor layer 802 may be formed by, e.g., epitaxial growth, and may be doped in situ during the epitaxial growth process. Alternatively, the epitaxially grown semiconductor material may be doped after growth using an implantation process. The lower doped semiconductor layer 802 forms what will become a bottom source/drain structure for the VTFET.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 9:
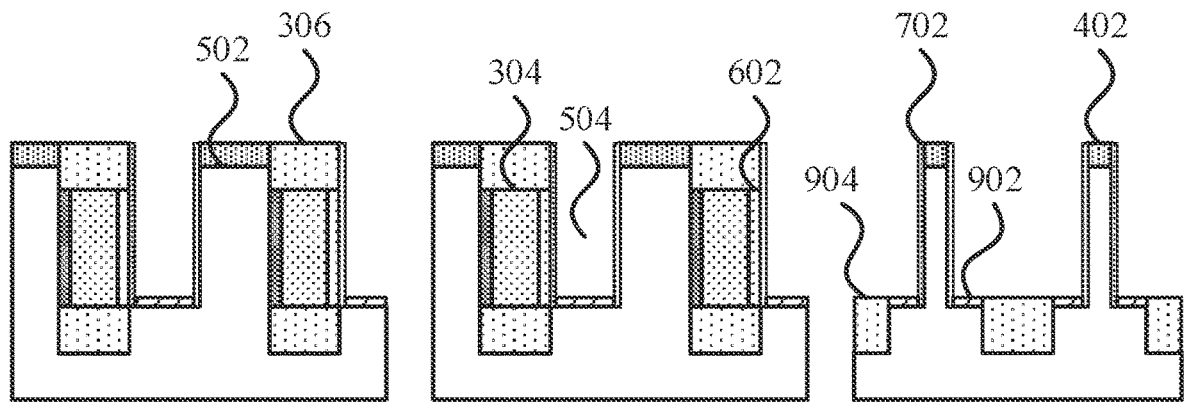
FIG. 9 is a set of cross-sectional views of a step in the formation of a semiconductor device, where shallow trench isolation regions are formed between neighboring fins, in accordance with an embodiment of the present invention.

Referring now to FIG. 9, a set of cross-sectional views are shown of a step in the fabrication of a semiconductor device. STI regions 904 are formed between fins 402 by etching down into the substrate 202 and depositing STI dielectric material in the resulting trenches. Portions of the lower doped semiconductor layer 802 may be protected using a protection layer, which may be removed after the STI regions 904 are formed. Removal of some of the epitaxial material leaves behind bottom source/drain structures 902.

Figure 10:
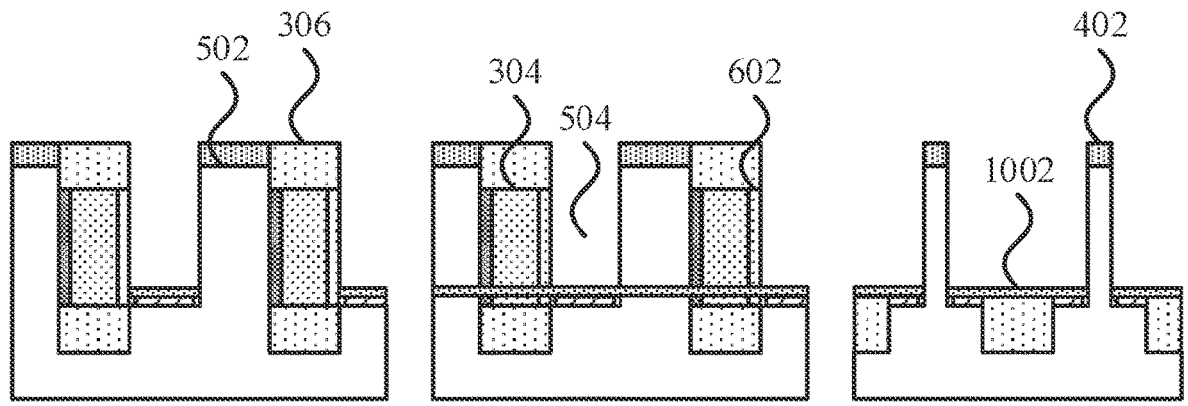
FIG. 10 is a set of cross-sectional views of a step in the formation of a semiconductor device, where a bottom spacer is formed over the bottom source/drain regions, in accordance with an embodiment of the present invention.

Referring now to FIG. 10, a set of cross-sectional views are shown of a step in the fabrication of a semiconductor device. A bottom spacer 1002 is formed over the bottom source/drain structures 902 and the exposed STI regions 904. As can be seen in the $Y_2Y_2$ cross-section, the bottom spacer is formed around the fins 402 and the dummy spacers 304. The bottom spacer 1002 may be formed from any appropriate dielectric material, such as silicon nitride, and may be formed using a directional deposition, such as directional CVD, PVD or GCIB deposition. Material for the bottom spacer may be deposited with a greater thickness on horizontal surfaces and a smaller thickness on vertical surfaces, followed by an etch back process to leave only the material on the horizontal surfaces. If the liner 702 is formed from the same material as the bottom spacer 1002, it may be removed before the formation of the bottom spacer 1002.

Figure 11:
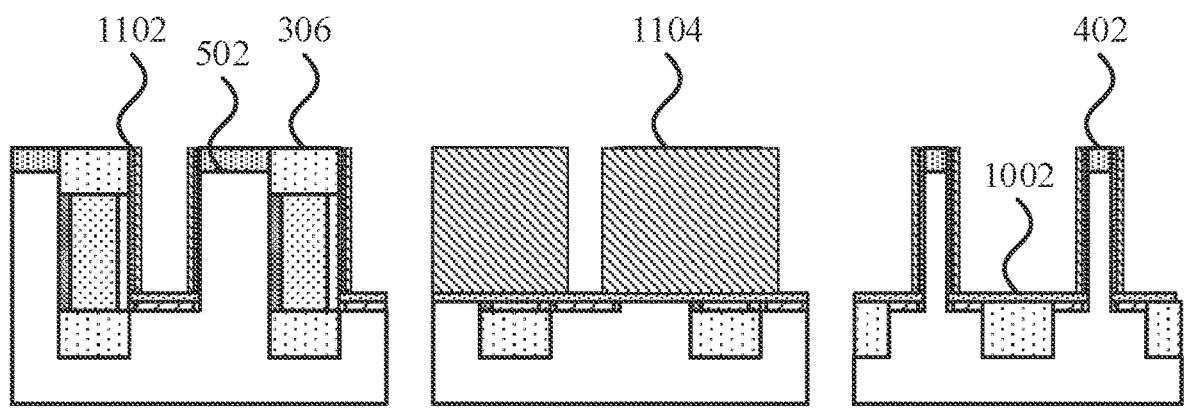
FIG. 11 is a set of cross-sectional views of a step in the formation of a semiconductor device, where a gate dielectric layer and work function metal layer are formed on sides of the fins, in accordance with an embodiment of the present invention.

Referring now to FIG. 11, a set of cross-sectional views are shown of a step in the fabrication of a semiconductor device. A gate dielectric layer 1102 and a work function metal layer 1104 are conformally deposited over the exposed surfaces. These layers may be removed from horizontal surfaces using one or more selective anisotropic etches. If the liner 702 was formed from a different material than the bottom spacer 1002, and remained during formation of that structure, the liner 702 may be removed before formation of the gate stack.

The gate dielectric layer 1102 may be formed from a high-k dielectric material. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The work function metal layer 1104 may include a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, a p-type work function metal layer may be formed from titanium nitride, titanium aluminum nitride, ruthenium, platinum, molybdenum, cobalt, and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is formed from at least one of titanium aluminum, tantalum nitride, titanium nitride, hafnium nitride, hafnium silicon, or combinations thereof. It should be understood that titanium nitride may play the role of an n-type work function metal or a p-type work function metal, depending on the conditions of its deposition.

Figure 12:
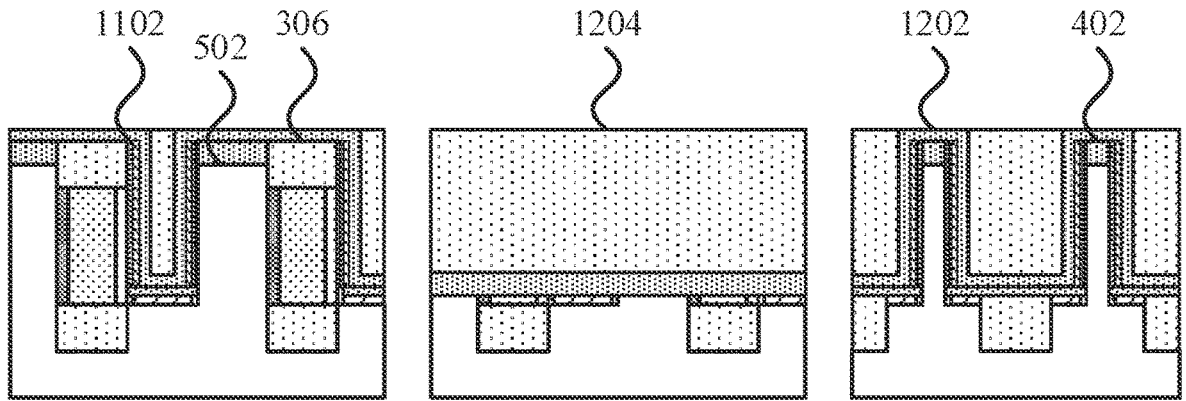
FIG. 12 is a set of cross-sectional views of a step in the formation of a semiconductor device, where a cap layer and interlayer dielectric are formed, in accordance with an embodiment of the present invention.

Referring now to FIG. 12, a set of cross-sectional views are shown of a step in the fabrication of a semiconductor device. A cap layer 1202 is conformally formed over the fins 402, for example using a deposition process such as CVD or ALD and a dielectric material such as silicon nitride. An interlayer dielectric 1204 is then filled in around the fins 402, for example using a flowable CVD process and silicon dioxide or any other appropriate dielectric material.

Figure 13:
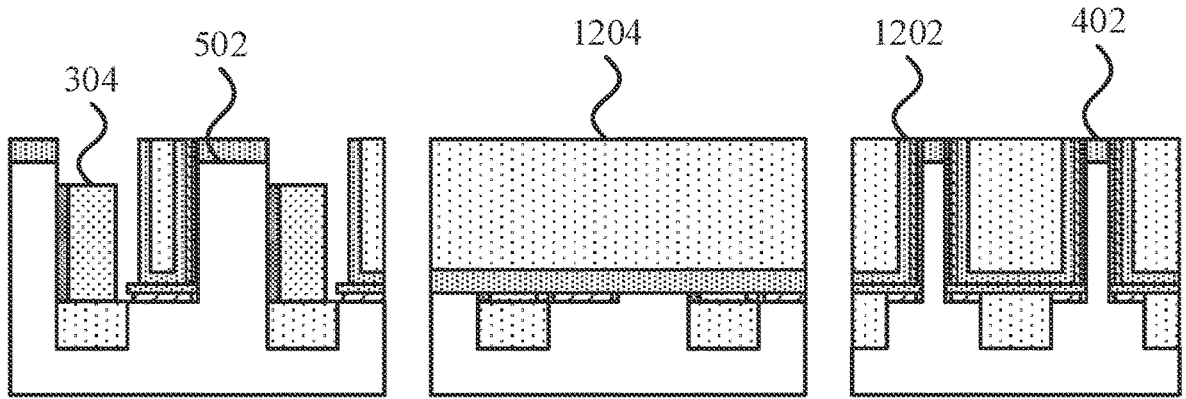
FIG. 13 is a set of cross-sectional views of a step in the formation of a semiconductor device, where the sacrificial spacer is etched away to create a gap at the side of the dummy gate, in accordance with an embodiment of the present invention.

Referring now to FIG. 13, a set of cross-sectional views are shown of a step in the fabrication of a semiconductor device. One of the dummy gates 304 is exposed by a series of steps that may include, e.g., a CMP to expose the top dielectric spacer 306 and selective etches to remove the exposed top dielectric spacer 306, the exposed portion of gate dielectric 1102, the exposed portion of work function metal 1104, and the exposed sacrificial spacer 602.

Figure 14:
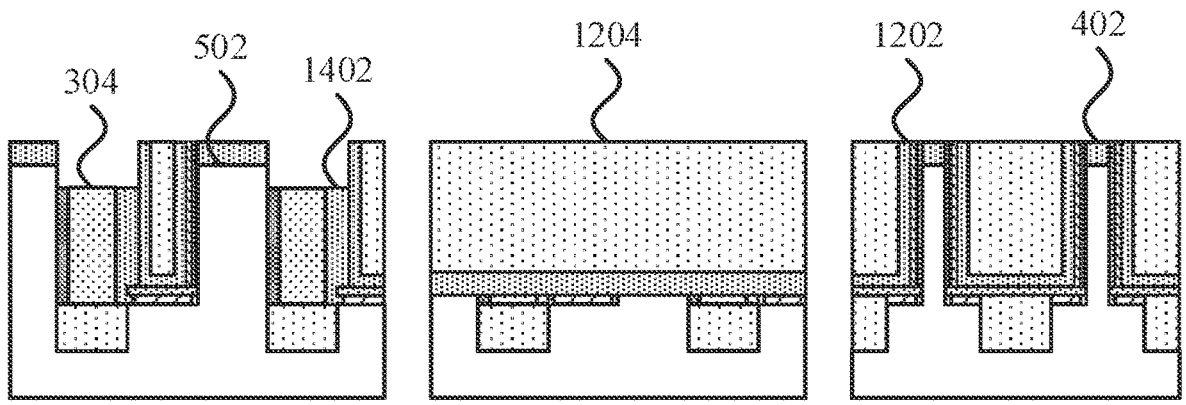
FIG. 14 is a set of cross-sectional views of a step in the formation of a semiconductor device, where an isolation spacer is formed in the gap at the side of the dummy gate, in accordance with an embodiment of the present invention.

Referring now to FIG. 14, a set of cross-sectional views are shown of a step in the fabrication of a semiconductor device. An isolation spacer 1402 is filled into the gap between the dummy gate 304 and the cap layer 1202. The isolation spacer 1402 may be formed from, e.g., silicon nitride. The isolation spacer 1402 may be formed by, e.g., depositing material with a deposition process that pinches off at the surface of the gap, followed by a selective anisotropic etch that removes material from the horizontal surfaces.

Figure 15:
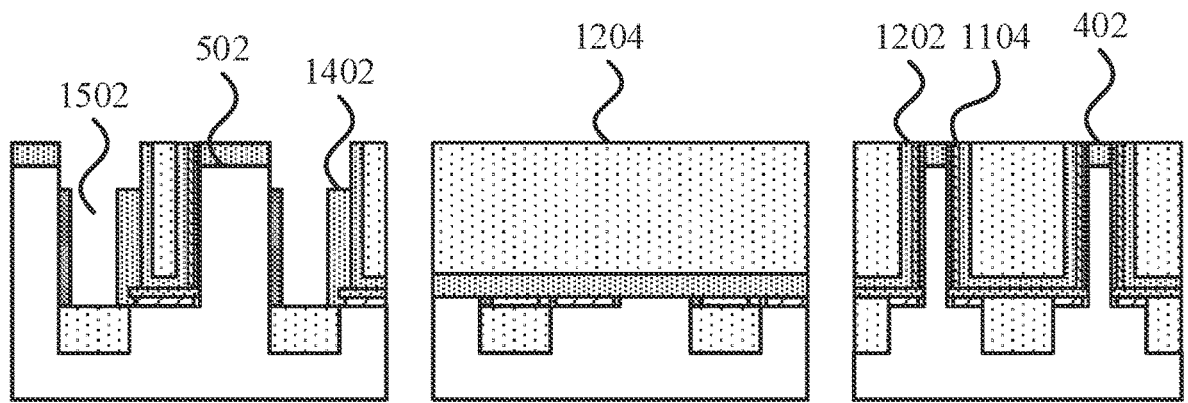
FIG. 15 is a set of cross-sectional views of a step in the formation of a semiconductor device, where the dummy fin is etched away, in accordance with an embodiment of the present invention.

Referring now to FIG. 15, a set of cross-sectional views are shown of a step in the fabrication of a semiconductor device. The dummy gates 304 are selectively etched away, leaving gaps 1502. As shown in the XX cross-section, there remains portions of the work function metal layer 1104 on the sidewalls of the fins 402, which connects to a gate work function metal and that may be used as gate connection.

Figure 16:
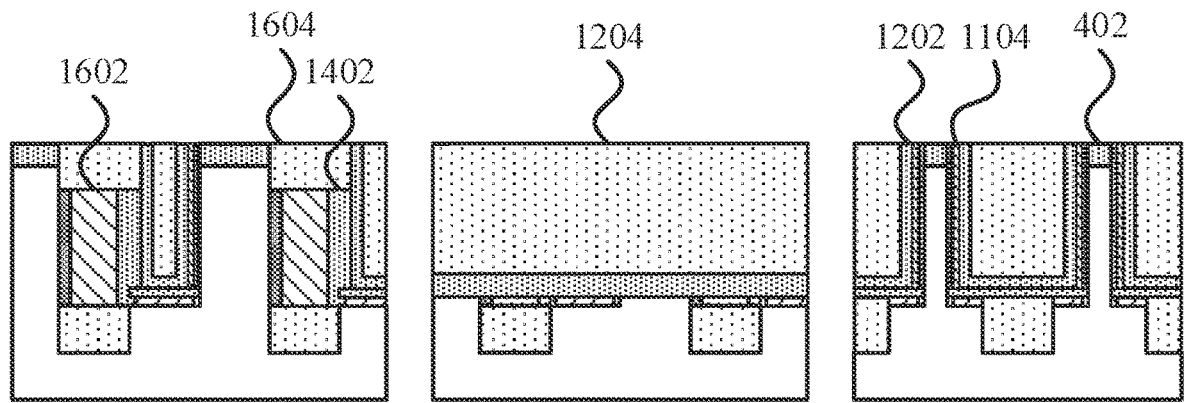
FIG. 16 is a set of cross-sectional views of a step in the formation of a semiconductor device, where a gate conductor is formed, in accordance with an embodiment of the present invention.

Referring now to FIG. 16, a set of cross-sectional views are shown of a step in the fabrication of a semiconductor device. The gaps 1502 are filled by a conductor 1602, using any appropriate deposition process, followed by a recessing etch to bring the conductor to side wall of a same height as the isolation spacer 302. The conductor 1602 may be formed from any appropriate conductive material, such as tungsten, nickel, titanium, molybdenum, tantalum, copper, platinum, silver, gold, ruthenium, iridium, rhenium, rhodium, cobalt, and alloys thereof. The conductor 1602 may alternatively be formed from a doped semiconductor material such as, e.g., doped polysilicon. Additional interlayer dielectric material (e.g., silicon dioxide) may be deposited over the conductor 1602 using any appropriate deposition process, and may be polished down to the level of the cap layer 1202 using CMP.

Figure 17:
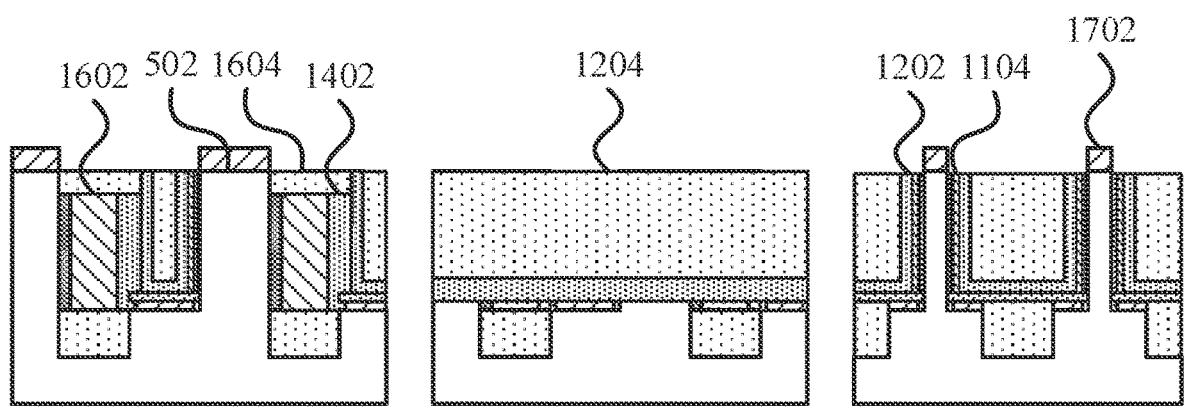
FIG. 17 is a set of cross-sectional views of a step in the formation of a semiconductor device, where top source/drain structures are formed on top surfaces of the fins, in accordance with an embodiment of the present invention.

Referring now to FIG. 17, a set of cross-sectional views are shown of a step in the fabrication of a semiconductor device. The top surface is polished down, for example using CMP, to expose the tops of the channel regions 502. Top source/drain structures 1702 are formed on the channel regions, for example using an epitaxial growth process. At this stage, the VTFET devices may be completed by forming conductive contacts, including a gate contact that contacts the conductor 1602, the bottom source/drain structure 902, and the top source/drain structure 1702.

Figure 18:
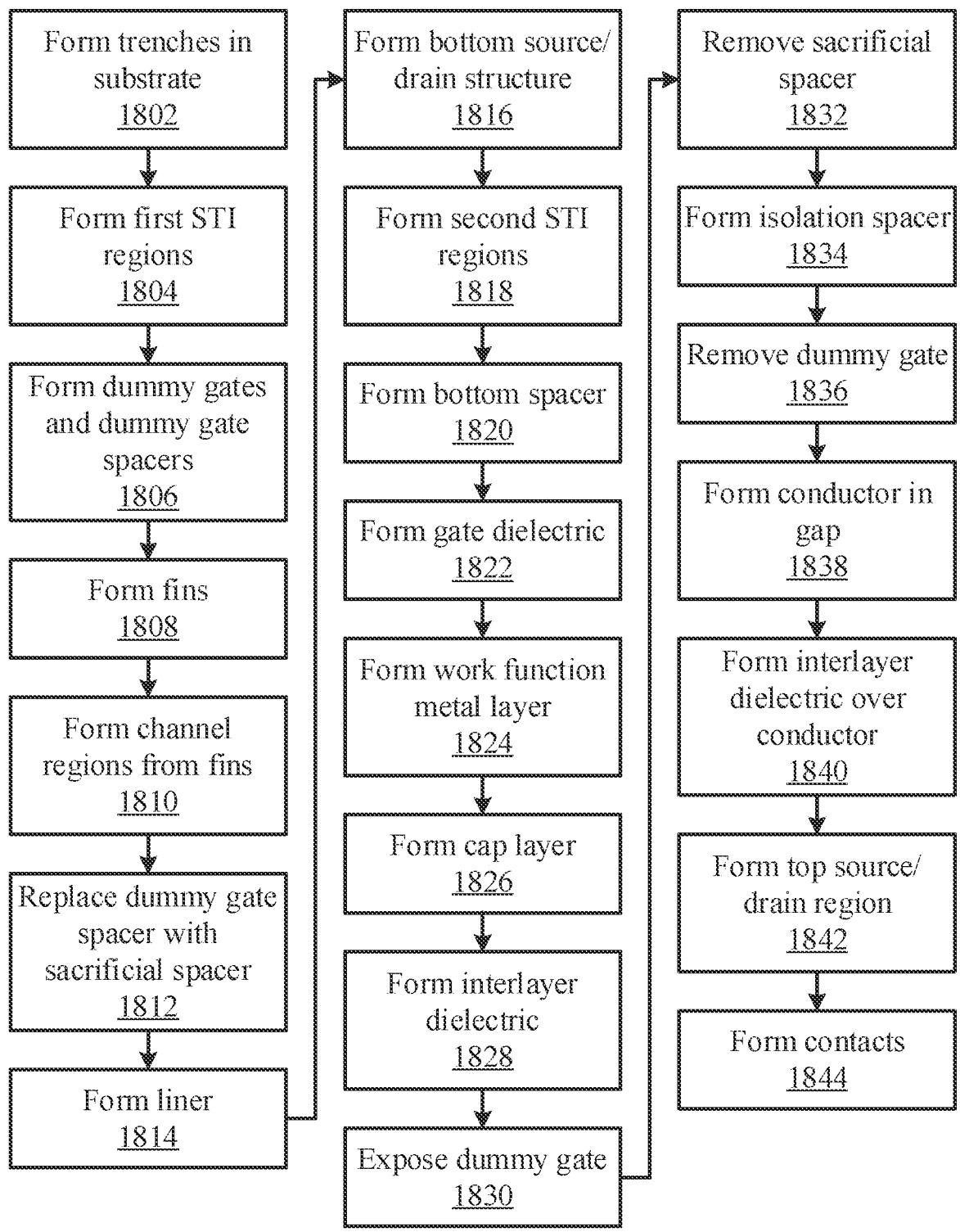
FIG. 18 is a block/flow diagram of a method of forming semiconductor devices with thick isolation spacers between a gate conductor of a first device and a bottom source/drain of a second device.

Referring now to FIG. 18, a method for forming a semiconductor device is shown. Block 1802 forms trenches 206 in a substrate, for example by forming a hardmask pattern 204 using photolithography and then anisotropically etching down into a semiconductor substrate 202 using, for example, an RIE process. Block 1804 forms first drain regions 208 in the trenches 206, for example depositing a silicon dioxide material into the trenches 206 using any appropriate deposition process and then recessing the silicon dioxide material to an appropriate height.

Block 1806 forms dummy gate spacers 302 on sidewalls of the trenches 204, for example using a conformal deposition process, followed by an anisotropic etch that removes spacer material from horizontal surfaces. Block 1806 also forms the dummy gates 304, for example depositing dummy gate material using any appropriate deposition process and recessing to a same height as the dummy gate spacers 302.

Block 1808 then forms fins 402, patterning the hardmask layer 204 and then etching anisotropically down into the substrate 202. Block 1810 further patterns the fins 402 to form channel regions 502, with gaps 504 being anisotropically etched out of the substrate 202 that expose at least one dummy gate spacer 302. The exposed dummy gate spacer(s) 302 are selectively etched away, and are replaced with a sacrificial spacer of a distinct material in block 1812, for example using a selective isotropic etch, followed by a conformal deposition, followed by an anisotropic etch that selectively etches away the sacrificial material in areas that are not protected by an upper spacer 306.

Block 1814 forms a liner 702 using a conformal deposition process, followed by an anisotropic etch that exposes horizontal surfaces of the semiconductor substrate in the gaps 504 and around the fins 402. A lower doped semiconductor layer 802 is formed by block 1816, for example using an epitaxial growth process and in situ doping. Block 1818 forms second STI regions 904 between fins 402, which also separates the lower doped semiconductor layer 802 into lower semiconductor structures 902. Block 1808 may form a photolithographic pattern and then anisotropically etch down into the substrate 202 between the fins 402, and then may remove the mask from that photolithographic pattern. Block 1820 forms a bottom spacer 1002 over the bottom source/drain structures 902 and the second STI regions 904.

Block 1822 forms a gate dielectric 1102, for example depositing a high-k dielectric material using a conformal deposition process and then anisotropically etching away the gate dielectric material from horizontal surfaces. Block 1824 similarly forms a work function metal layer 1104, leaving a stack of the gate dielectric 1102 and the work function metal layer 1104 on sidewalls of the fins 402 and the channel region 502.

Block 1826 forms a cap layer, for example by conformally depositing a silicon nitride layer, and then block 1828 forms an interlayer dielectric 1204 to fill the gaps using any appropriate deposition process. Block 1830 etches down, using any appropriate patterning and etching steps, to expose the dummy gates 304. Block 1832 removes the sacrificial spacers 602 using a selective etch, which exposes a sidewall of the dummy gates 304. Block 1834 then forms isolation spacers 1402 in the gap left by the removal of the sacrificial spacers 602.

Block 1836 removes the dummy gates 304 using a selective etch, leaving gaps 1502. Block 1838 then forms a conductor 1602 in the gaps 1502 and block 1840 forms an interlayer dielectric 1604 over the conductor 1602. Block 1842 removes remnants of the hardmask layer 204 to expose semiconductor surfaces of the fins 402, and then forms top source/drain regions 1702 by, e.g., an epitaxial growth process with in situ doping. Block 1844 forms appropriate electrical contacts, including contacts to the bottom source/drain structures 902, the conductor 1602, and the top source/drain regions 1702.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a self-aligned gate contact for VTFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
    a semiconductor substrate;
    a first transistor device in a first device region of the semiconductor substrate, comprising:
        a first channel fin formed in the semiconductor substrate;
        a first bottom source/drain structure on the semiconductor substrate, laterally adjacent to the channel fin on a first side of the channel fin;
        a gate conductor on a second side of the first channel fin, opposite the first side;
        a first gate conductor spacer between the first channel fin and the gate conductor, formed from a first dielectric material; and
        a second gate conductor spacer formed on a second side of the gate conductor opposite to the first gate conductor spacer, formed from a second dielectric material that is different from the first dielectric material; and
    a second transistor device in a second device region of the semiconductor substrate, comprising:
        a second channel fin formed in the semiconductor substrate; and
        a second bottom source/drain structure on the semiconductor substrate, laterally adjacent to the second channel fin on the first side of the second channel fin, the second bottom source/drain structure being laterally adjacent to the second channel fin, wherein the second gate conductor spacer insulates the gate conductor of the first transistor device from the second bottom source/drain structure of the second transistor device.

2. The semiconductor device of claim 1, wherein the second gate conductor spacer has a greater thickness than the first gate conductor spacer.

3. The semiconductor device of claim 1, further comprising a gate dielectric layer on a side of the first channel fin opposite to the first gate conductor spacer.

4. The semiconductor device of claim 1, further comprising a work function metal layer on the gate dielectric layer.

5. The semiconductor device of claim 1, further comprising a cap layer over the bottom source/drain structure, the cap layer having sidewalls rising from opposite edges of the bottom source/drain structure.

6. The semiconductor device of claim 1, where the first transistor device and the second transistor device are vertical field effect transistors.

7. A semiconductor device, comprising:
    a semiconductor substrate;
    a first transistor device in a first device region of the semiconductor substrate, comprising:
        a first channel fin formed in the semiconductor substrate;
        a first bottom source/drain structure on the semiconductor substrate on a first side of the channel fin, wherein the first bottom source/drain structure is laterally adjacent to the first channel fin;
        a gate conductor on a second side of the first channel fin, opposite the first side;
        a first gate conductor spacer between the first channel fin and the gate conductor, formed from a first dielectric material; and
        a second gate conductor spacer formed on a second side of the gate conductor opposite to the first gate conductor spacer, formed from a second dielectric material that is different from the first dielectric material; and
    a second transistor device in a second device region of the semiconductor substrate, comprising:
        a second channel fin formed in the semiconductor substrate; and
        a second bottom source/drain structure on the semiconductor substrate on the first side of the second channel fin, the second bottom source/drain structure being laterally adjacent to the second channel fin, and the second bottom source/drain structure protruding into the second gate conductor spacer of the first transistor device,
    wherein the second gate conductor spacer insulates the gate conductor of the first transistor device from the second bottom source/drain structure of the second transistor device.

8. The device of claim 7, further comprising a bottom spacer, above the bottom source/drain structure, that is partially embedded in the gate conductor spacer.

9. The device of claim 8, wherein the bottom surface of the bottom spacer and the bottom source/drain structure are above the semiconductor substrate at a height above a bottom surface of the second gate conductor spacer.

* * * * *